United States Patent
Trotter et al.

(10) Patent No.: US 7,327,295 B1
(45) Date of Patent: Feb. 5, 2008

(54) CONSTANT EDGE-RATE TERNARY OUTPUT CONSECUTIVE-EDGE MODULATOR (CEM) METHOD AND APPARATUS

(75) Inventors: Brian David Trotter, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/343,027

(22) Filed: Jan. 30, 2006

Related U.S. Application Data

(60) Provisional application No. 60/729,685, filed on Oct. 24, 2005.

(51) Int. Cl.
*H03M 3/00* (2006.01)

(52) U.S. Cl. ..................... 341/143; 341/144

(58) Field of Classification Search ......... 341/143–170
See application file for complete search history.

(56) References Cited

U.S. PATENT DOCUMENTS

| | | | |
|---|---|---|---|
| 5,708,433 | A | 1/1998 | Craven |
| 5,815,102 | A | 9/1998 | Melanson |
| 5,901,176 | A * | 5/1999 | Lewison .......... 375/238 |
| 5,933,453 | A * | 8/1999 | Lewison .......... 375/238 |
| 6,150,969 | A | 11/2000 | Melanson |
| 6,373,334 | B1 | 4/2002 | Melanson |
| 6,489,901 | B1 | 12/2002 | Venkitachalam et al. |
| 6,693,571 | B2 | 2/2004 | Melanson et al. |
| 6,697,004 | B1 | 2/2004 | Galton et al. |
| 6,724,332 | B1 | 4/2004 | Melanson |
| 6,727,832 | B1 | 4/2004 | Melanson |
| 6,738,004 | B2 | 5/2004 | Melanson |
| 6,744,392 | B2 | 6/2004 | Melanson |
| 6,762,704 | B1 * | 7/2004 | Melanson et al. .......... 341/143 |
| 6,816,100 | B1 | 11/2004 | Galton |
| 6,885,330 | B2 | 4/2005 | Trotter et al. |
| 6,965,335 | B1 | 11/2005 | Trotter et al. |
| 6,967,607 | B2 | 11/2005 | Melanson |
| 7,006,028 | B2 | 2/2006 | Galton |

OTHER PUBLICATIONS

Craven, Toward the 24-bit DAC: Novel Noise-Shaping Topologies Incorporating Correction for the Nonlinearity in a PWM Output Stag, Journal of the AES, May 1993, pp. 291-313, vol. 41, No. 5, Publisher: Audio Engineering Society, Published in: US.

(Continued)

*Primary Examiner*—Lam T. Mai
(74) *Attorney, Agent, or Firm*—Andrew M. Harris; Mitch Harris, Atty at Law, LLC

(57) ABSTRACT

A constant edge-rate ternary output consecutive-edge modulator (CEM) method and apparatus provides improved dynamic range in a noise-shaped CEM ternary pulse generator. A noise shaper shapes an input signal that is supplied to a pair of CEMs through a mismatch shaper or other code splitter that assigns unequal pulse width portions (the extra count in odd counts) between the pair of CEMs. The range of pulse width out of the CEMs can then be allowed to extend to the full sample period for one or possibly both of the CEMs in a given cycle. A control circuit overrides the mismatch shaper's assignment of the unequal pulse width portions when a previous pulse period yielded no transition from a given CEM, so that the given CEM is guaranteed to have a transition in the current pulse period.

19 Claims, 4 Drawing Sheets

OTHER PUBLICATIONS

Vankka, et al., A GSM/EDGE/WCDMA Modulator With On-Chip D/A Converter for Base Stations, IEEE Transactions on Circuits and Systems—II: Analog and Digital Signal Processing, Oct. 2002, pp. 645-655, vol. 49, No. 10, Publisher: IEEE , Published in: US.

* cited by examiner

CONSTANT EDGE-RATE TERNARY OUTPUT CONSECUTIVE-EDGE MODULATOR (CEM) METHOD AND APPARATUS

CROSS-REFERENCE TO RELATED APPLICATIONS

This application claims priority under 35 U.S.C. §119(e) to U.S. Provisional Patent Application Ser. No. 60/729,685, filed on Oct. 24, 2005. This application is further related to co-pending application Ser. No. 11/297,011, filed on Dec. 8, 2005 and entitled "EXTENDED DYNAMIC RANGE CONSECUTIVE EDGE MODULATION (CEM) METHOD AND APPARATUS". The above-referenced application and the present application have at least one inventor in common and are assigned to the same Assignee.

BACKGROUND OF THE INVENTION

1. Field of the Invention

The present invention relates generally to consecutive edge modulators, and more specifically, to a consecutive-edge modulator (CEM) having a ternary output and a constant edge-rate.

2. Background of the Invention

Consecutive edge modulators (CEMs) are desirable in applications such as digital-to-analog (D/A) converters and power output circuits due to the effectively doubled control update rate at a given output frequency over that of a traditional pulse width modulator (PWM). Since the pulse output is controlled with respect to both the leading edge and the trailing edge, the control function is more responsive, leading to a lower operating frequency for a given required response.

In particular, in applications requiring a highly stable and accurate output, the CEM output circuit is driven by a noise-shaping modulator that pushes the conversion "noise", produced due to the discrete nature of the modulator's quantized output, to the high end of the frequency spectrum, where the output filters can effectively remove the noise. Ternary CEMs also provide increased accuracy through improved resolution per quantizer sample, by doubling the possible number of codes per pulse. In some ternary CEM implementations, a pair of CEMs are used to control generation of two streams that either correspond to positive pulses and negative pulses or pulses of the same sign, where the output states correspond to zero, half-maximum and maximum output. For a given quantizer output, the value is divided evenly between the two outputs with any remainder count assigned between the two output streams.

A mismatch shaper typically provides the assignment of the portions of the quantizer output values so that while the assignment of any remainder count is not completely random, the artifacts of the assignment are shaped in the frequency domain so that no undesirable artifacts are generated by the assignment. However, other code-splitting circuits may be used to assign the remainder between the output pulse streams. Any code splitter other than a simple alternating assignment of the remainder count raises the possibility that sequentially adjacent codes will cause a missing transition if non-transitioning codes are permitted for either CEM stream. Simple alternation is generally undesirable, since the attenuation of artifacts introduced by the alternation is low unless the oversampling rate is very high.

A constant edge rate (fixed output frequency) is typically desired for linearity and low distortion from the CEM circuits. Since a pulse is guaranteed to occur within a given window, the rise time and fall time of switching circuits connected to the output of the CEM contributes equally to each pulse period, thereby contributing little or no non-linearity. However, in a ternary CEM (i.e., a CEM that has three distinct output levels), it is possible to have states in which no transition occurs during a particular sample period. In the dual-code ternary system there are possible codes for which there is no transition on one output and other codes for which there is no transition on both outputs. Permitting the range of edge positions to extend to represent either type of non-transitioning code results in distortion and non-linearity in the result of the CEM conversion, when sequentially adjacent samples on one or more of the outputs are at the maximum or minimum value. Existing circuits overcome the above-described problem by constraining the output of the modulator, disallowing those maximum or minimum codes that would result in no transition being generated on one or both of the outputs during a pulse period.

However, such a solution causes loss of substantial dynamic range where the number of overall codes is small. For example, if the total count of the quantizer output of the noise-shaper has 17 levels (−8 to +8), the effective output of the CEM is limited to 13 levels, resulting in a dynamic range that is only approximately 75% of the possible dynamic range. The two quantizer output levels corresponding to full on or full off (−8 and +8) must be disallowed, as either case results in a pulse period with no transition on either output. The quantizer output levels that correspond to only an off count of magnitude 1 (−7 and +7) must also be disallowed, because one of the two outputs will be have no transition during the sample period and if two such codes occur consecutively, a transition will be missed during a sample period. All other values can be supported by the two outputs without having one of the outputs in the off condition for any sample interval, but as noted above, the penalty is loss of substantial potential dynamic range.

Therefore, it would be desirable to provide a noise-shaped PWM method and apparatus that provide operation over a wider dynamic range without generating substantial distortion and/or non-linearity.

SUMMARY OF THE INVENTION

The above stated objectives are achieved in a method and apparatus for pulse generation using a noise-shaped consecutive edge modulator (CEM). The method is a method of operation of the apparatus.

The apparatus includes a delta-sigma noise-shaping modulator providing input to a ternary CEM. The CEM permits a wider range of control output from the noise-shaping modulator resulting in wider dynamic range.

The apparatus includes a noise shaper having an output coupled to a code splitter that provides inputs to a pair of CEMs. The code splitter, which may be a mismatch shaper, assigns the remainder count present in odd count values to one or the other CEM, so that pulse width differences between the two CEM outputs are distributed according to the design of the code splitter. The range of the CEMs is generally permitted to extend to at least the full range except for codes that would generate no pulse at both outputs, and an additional control circuit is provided (or the code splitter is modified) so that the assignment of odd pulse widths is overridden (code splitter ordinary assignment condition violated) when a pulse would be missed on one of the outputs during a sample period.

Optionally, all possible codes from the noise shaper could be permitted through the code splitter, so that infrequent occurrences of periods with no pulse can be permitted. Alternatively, the pulse edges prior to and following a given pulse edge can be observed and if both have a width less than the entire pulse portion edge position range on both outputs, then a code that will generate no transition on either output can be permitted for the given pulse portion.

The CEM outputs can either control analog stages such as switches for switching positive and negative voltages or currents, respectively, or can be input to digital filtering stages that subsequently provide for generation of analog signals via control of analog output circuits.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

Figure 1:
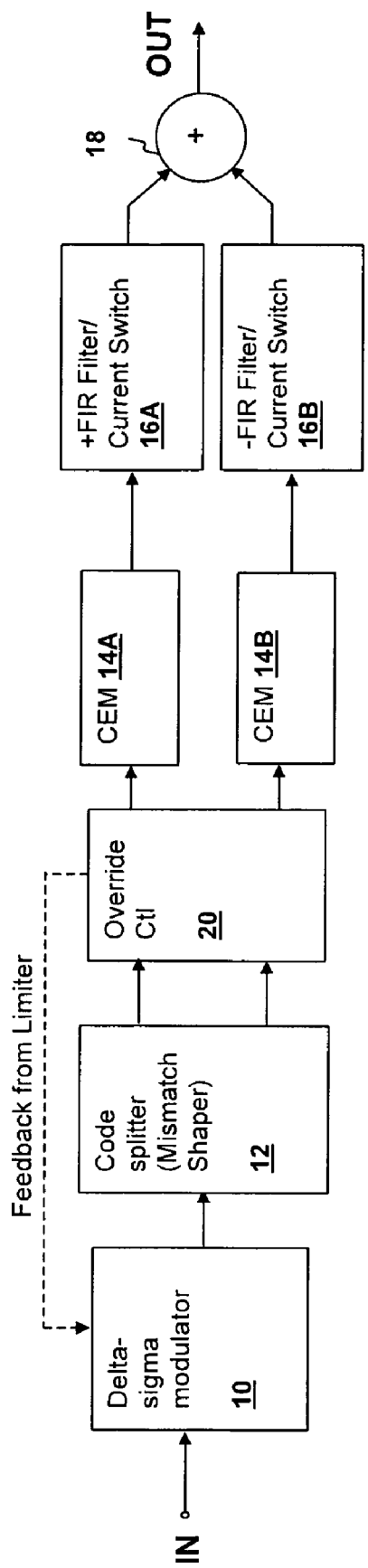
FIG. 1 is a block diagram depicting an apparatus in accordance with an embodiment of the present invention.

The present invention encompasses a method and apparatus for producing a ternary consecutive edge modulated signal having an extended dynamic range, while maintaining a constant edge rate. The dynamic range is extended without distortion or with reduced distortion by violating the code splitter's ordinary assignment of the remainder count portion of CEM codes (the extra count in odd counts) in a dual-stream CEM that implements a ternary CEM. The remainder count assignment is generally made by a mismatch shaper that takes the output of the quantizer of a delta-sigma modulator noise-shaper and assigns codes between two pulse outputs provided by corresponding CEMs according to the mismatch shaper's response and the code history. However, other remainder count assignment mechanisms may be used to assign the remainder counts and the present invention extends to any multi-stream CEM in which codes are reassigned between the streams to avoid sequentially adjacent maximum or minimum codes in one of the CEM stream that would cause a transition to be missed in a pulse output period.

The exception to the assignment made by the code splitter may be made by a processing circuit that receives the output of the code splitter shaper, or may be implemented in the logic of the code splitter itself. In the exemplary embodiment, the width of the previous pulse edge portion generated at each output is examined. In the event that no transition was present on one of the outputs in the previous pulse edge portion and if a full-width code is to be assigned in the current portion, then the non-transition code is not assigned to the output that had the full-width code in the previous edge portion. However, the present invention also contemplates look-ahead circuits that observe two or more samples in each CEM code stream and swap codes between the CEM code streams to avoid adjacent maximum or minimum (non-transition) code values.

The above-described action ensures that the minimum and maximum codes permitted from the noise shaper will generate a transition for each period on each output. If partial codes can cause no transition on one output, then those partial codes cannot be assigned twice to the same two outputs. The result is that no "missing edge" distortion is introduced by permitting the output codes to extend to one code away from the maximum and minimum possible code range for each polarity. The only error that will be present is due to the exception to the assignment of the unequal pulse portions, which may alter the spectral distribution of mismatch correction slightly.

If some occasional "missing pulse" distortion can be tolerated, then the codes can be permitted to extend to the full possible range of codes, and the invention will still result in greatly reduced distortion, especially as the single cell count value corrected for the missing pulse condition should be statistically more frequent than the extreme codes that have no transition for either CEM output. Alternatively, the previous pulse and following pulse can be observed and if both the previous and following pulse for a given pulse have transitions in both output streams, then any code can be assigned for the given pulse without generating distortion. As another alternative, if one of the previous and following codes has no transition, then the output of the quantizer can be limited, causing no missing edge under any condition. The technique that is more desirable is dependent on the relative distortion cost of clipping the signal value versus the distortion due to a missing edge. A feedback signal can be provided to correct for any limiting performed by the override circuit by changing the value of the quantizer output to reflect the limited value, thereby closing the noise-shaper loop around the limiter.

Referring now to FIG. 1, an apparatus in accordance with an embodiment of the invention is shown. An input value IN is converted to an analog value by the depicted cascade of stages. First, a delta-sigma noise-shaping modulator 10 provides a quantized output corresponding to the input value, and the quantized input is assigned between one of two output streams by a code-splitter (mismatch shaper) 12 according to the shaping function. An override control circuit 20 determines when to generate an exception to the assignment made by the mismatch shaper by detecting when one of the two streams would generate no transition for two sequentially adjacent samples when output to their respective consecutive edge modulators (CEMs) 14A, 14B.

The outputs of CEMs 14A, 14B are then converted to an analog value by a pair of finite impulse response (FIR) filter current switches 16A, 16B that provide filtering and very accurate analog conversion by using a large number of switches to switch currents in conformity with the taps of the FIR filter stages through which the output streams of CEM 14A, 14B are passed. The outputs of FIR filter/current switches 16A, 16B are combined by combiner 18 to provide an analog output signal. Details of FIR filter current switches suitable for use as FIR filter current switches 16A, 16B are described in U.S. Pat. No. 6,885,330, the specification of which is incorporated herein by reference.

Figure 2:
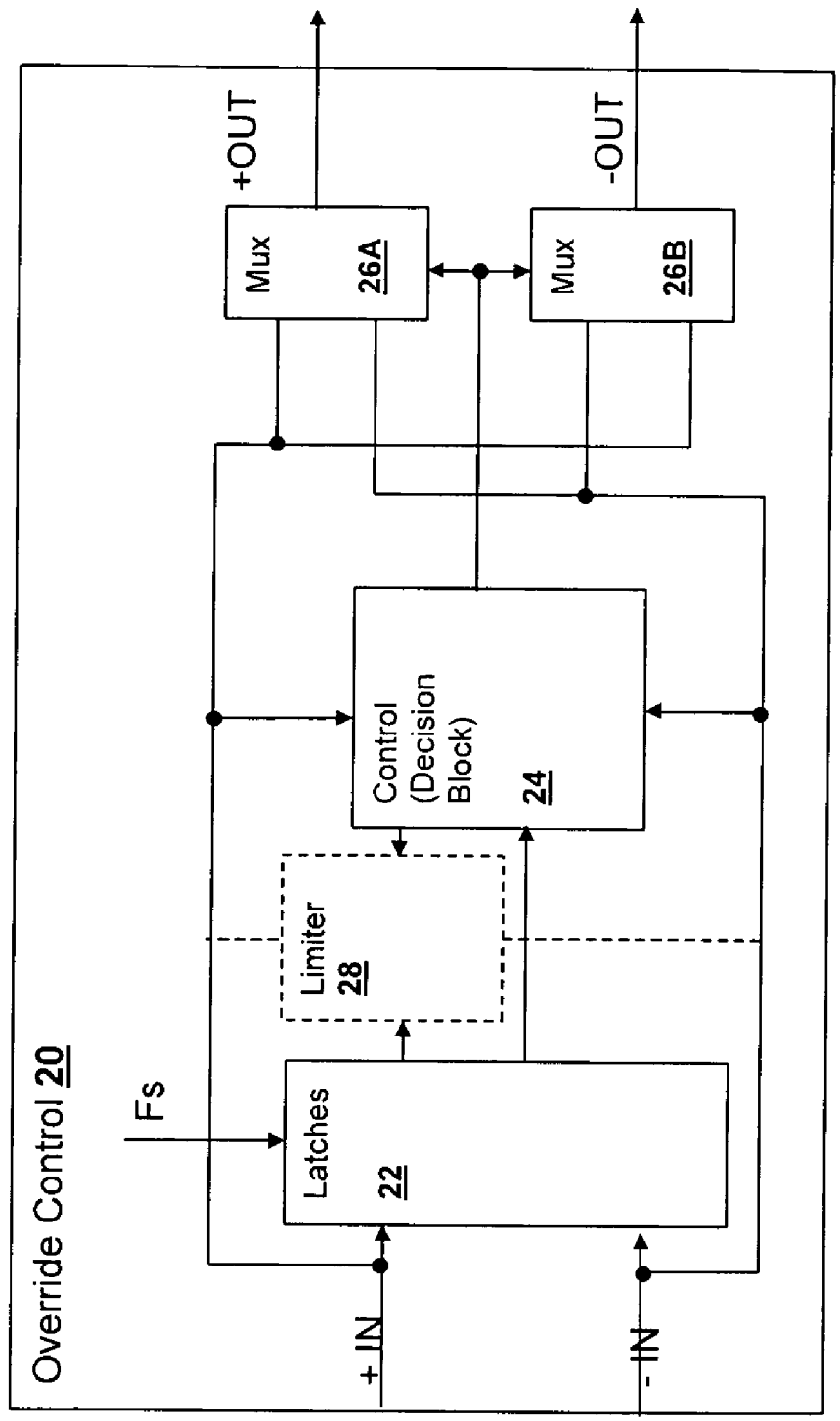
FIG. 2 is a block diagram depicting details of override control circuit 20 of FIG. 1.

Unique to the present invention is the presence of override control circuit 20, the details of which are depicted in FIG. 2 and with reference thereto, described below. A pair of latches 22 retains the previous quantizer output values from each output of code splitter 12. A control circuit 24 determines whether the code from the previous and present sample of each output of code splitter 12 both lie at the maximum or minimum value, which are values that would generate a pulse portion with no transition out of the corresponding CEM 14A, 14B. If so, then the control circuit 24 overrides the code splitter's assignment of the code portions by altering the selection inputs to multiplexers 26A and 26B, effectively "trading" the codes. The above-described example is true for implementations in which the codes are limited to total codes that will generate an edge for at least one of the output streams for each sample, therefore assuring that trading the codes will assign a transition where the assignment made by the code splitter would have generated no transition. Further, the depicted circuit is only exemplary and may be implemented by various arrangements of logic, including full implementation within code splitter shaper 12, as long as storage is available for comparing a previous code and a present code.

If, as mentioned above, the quantizer range is permitted to extend to values that would not generate a transition at either output of CEMs 14A–14B, then the trading of codes as described above would generate no effect, as both codes are the same when the maximum or minimum value is reached for two consecutive codes. Therefore, it will not matter what the value of the select signal from control circuit 24 is under the above-described condition. As long as occasional missing transitions can be tolerated, the invention will still reduce the frequency of the missing transitions by overriding the code splitter's assignment of codes that would generate consecutive transitions on one CEM output while no transitions for two edge portions on the other CEM output.

Alternatively, latches 22 can implement storage for two previous pulse codes and the inputs to multiplexers 26A–B taken from the middle sample and provided through an optional limiter 28, causing a single sample delay. Control circuit 24 then can determine whether the pulse portions surrounding the present pulse portion will both generate transitions for each stream and if so, control limiter 28 reduces the value of one of the codes so that no missing edge is generated. If the above-described limiting is performed by control limiter 28, then a feedback indication can be provided to delta-sigma modulator 10 so that the limited value is reflected into the noise-shaping loop.

Figure 3:
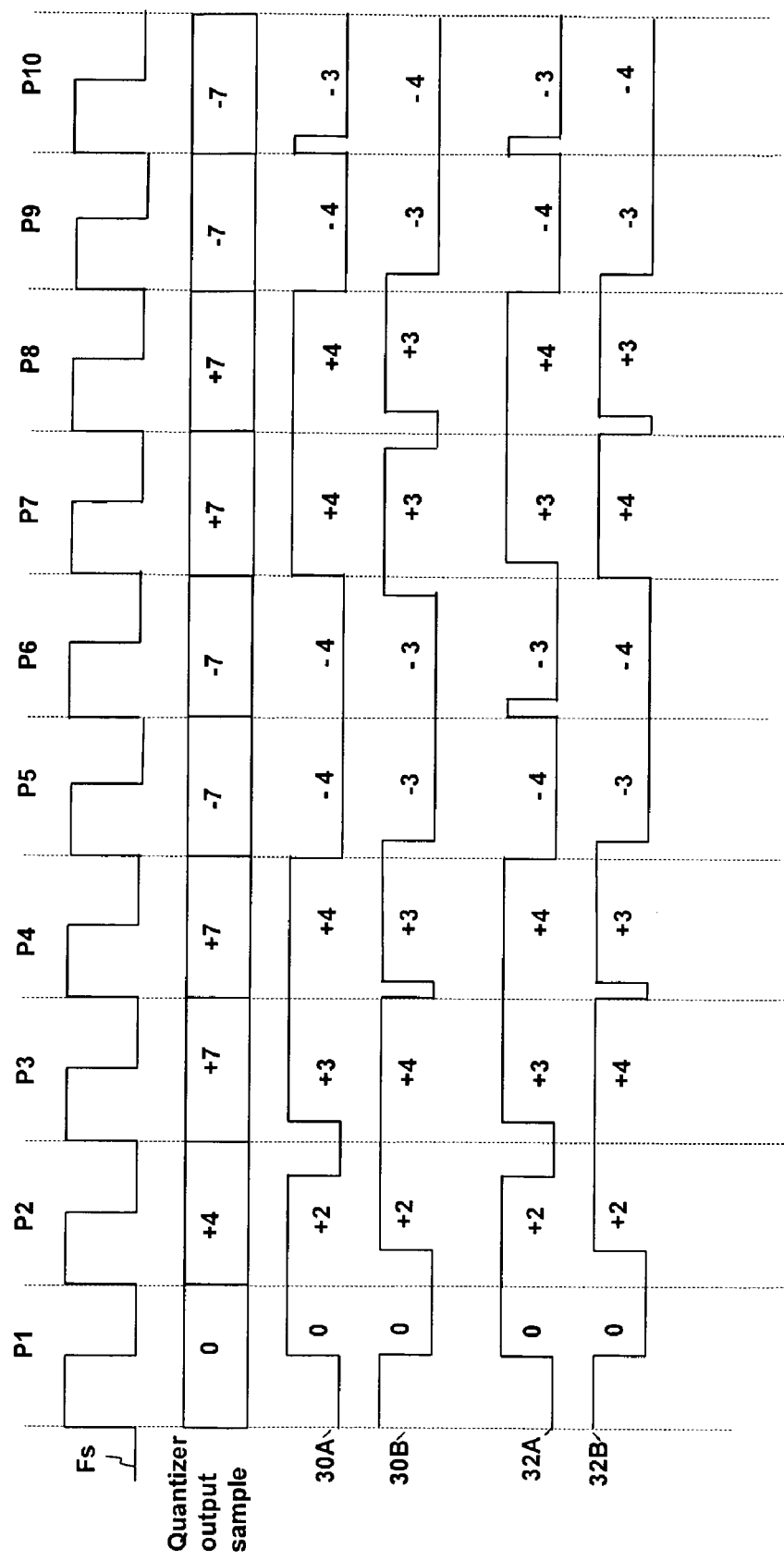
FIG. 3 is a timing diagram illustrating the operation of the apparatus of FIG. 1 in accordance with an embodiment of the present invention.

Referring now to FIG. 3, the operation of the present invention is depicted in a timing diagram. Two CEM streams 30A and 30B as would be generated without override control circuit 20 are contrasted with two CEM streams 32A and 32B as modified by override control circuit 20. In the first sample period P1, a zero reference value is shown, which has a 50% pulse portion width in each of CEM streams 30A–30B and 32A–32B. Other numbers shown for consecutive periods P2–P10 represent the number of counts of positive pulse value deviating from the zero-reference baseline count. Therefore, if the total number of counts per sample for each stream is 8, then the zero reference count will be a 4 count delay for a rising edge pulse portion or a 4 count on-time for a falling edge pulse portion. A –4 value then has no "on" counts and 8 "off" counts and a +4 value has all "on" counts and no "off" counts. Thus, the depicted signals are for a dual CEM system that sums the outputs (i.e., the analogs are both positive) and for a system in which a positive and negative output control are employed, one streams 30A or 30B and 32A or 32B will be inverted for each pair with respect to the streams shown.

For each quantizer output sample as shown ranging from –8 to +8, the values are split between codes for each CEM stream signal 30A,30B and 32A,32B. The total of the two codes is equal to the quantizer output for the given pulse portion (the rising edge portion for one stream is the falling edge portion for the other stream in the example). The action of override control circuit 20 is first seen in period P6. The code splitter's assignment of odd values in streams 30A,30B has led to two consecutive –4 codes in signal 30A, resulting in a missing edge. In signals 32A and 32B, the codes are traded (exchanged with each other) for period P6 in conformity with a determination that no transition was present on signal 32A for period P5. Signals 30A and 30B during periods P5 and P6 are an example of a sequence that will occur due to the code splitter's assignment of the code values split from the quantizer output. Signals 32A and 32B during period P6 represent correction of the condition. (In period P5, signals 32A and 32B are produced in conformity with the values generated by code splitter 12. Periods P3 and P4 illustrate a code assignment for which no correction is needed and periods P7 and P8 illustrate correction of the +7 code when two consecutive no transition codes were assigned to the same CEM output. Periods P9 and P10 represent the assignment of codes for the –7 quantizer output value when no correction is needed.

Figure 4:
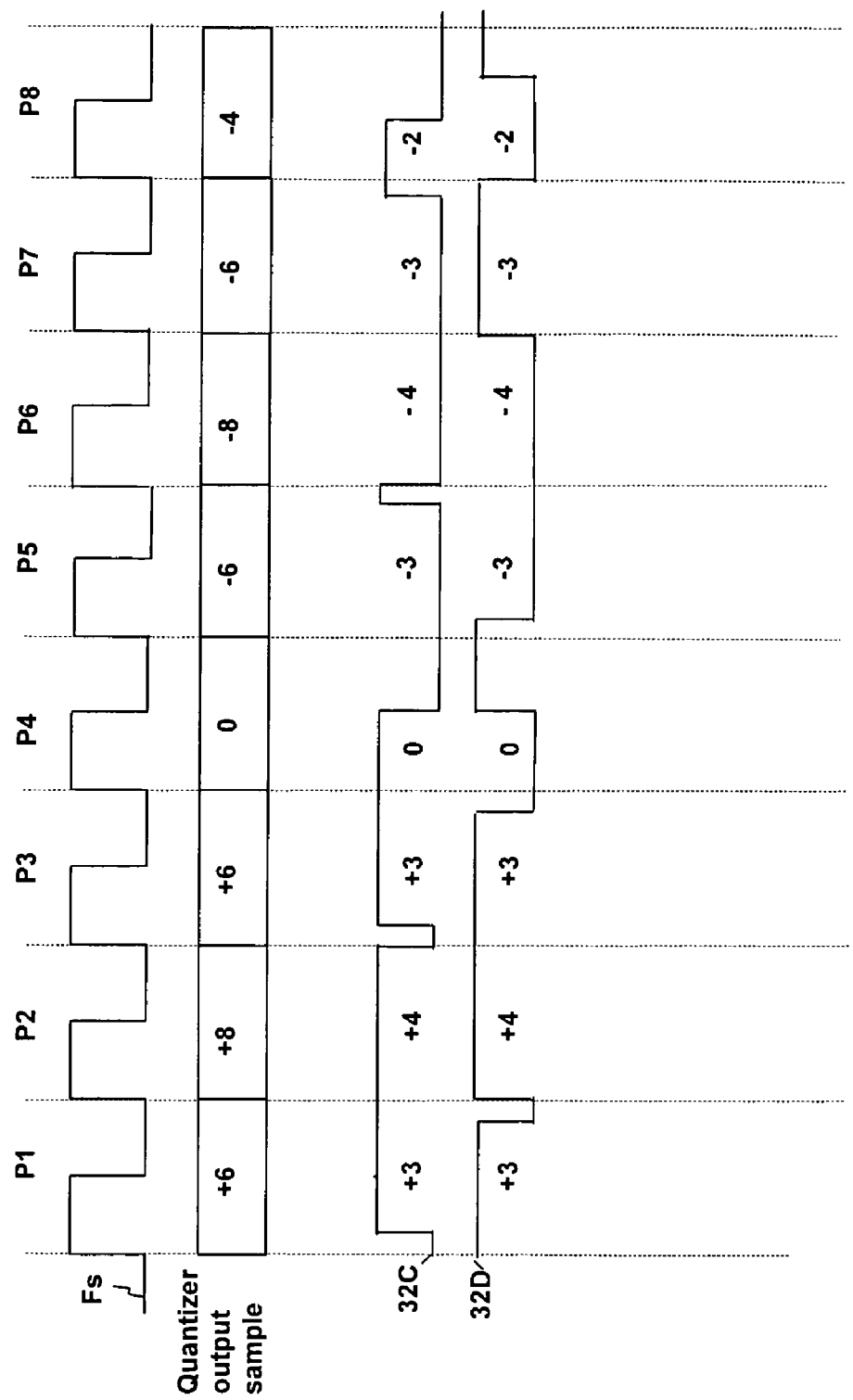
FIG. 4 is another timing diagram illustrating the operation of the circuit of FIG. 1 in accordance with another embodiment of the present invention.

Referring now to FIG. 4, an example of the alternative embodiment as described above is shown in a timing diagram. In period P2, a +4 code can be permitted on both output signals 32C and 32D without causing a missing pulse, as long as the code values for both CEM streams during the previous and subsequent periods are +3 or lower. As shown, a rate of one transition per pulse portion is maintained. Period P6 illustrates the case of a quantizer output of –8. As mentioned above, if the condition requiring a transition in each stream before and after the "no-transitions" code is not met, the quantizer output can be limited (and then subjected to trading codes if needed) or the missing edge can be tolerated.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A pulse generating circuit, comprising:
   a delta-sigma modulator;
   a code splitter having an input coupled to an output of said delta-sigma modulator for producing multiple code streams that in sum encode output samples of said delta-sigma modulator;
   multiple consecutive edge modulators each having an input coupled to a corresponding output of said code splitter, wherein said code splitter assigns remainder pulse counts between said code streams, and wherein values of said code streams extend to a range of values including at least one non-transition value; and
   an override circuit that reassigns codes between said code streams when sequentially adjacent non-transition values are detected in one of said code streams, wherein an edge rate of outputs of said consecutive edge modulators is made more constant.

2. The pulse generating circuit of claim 1, wherein said code splitter is a mismatch shaper.

3. The pulse generating circuit of claim 1, wherein said code splitter provides a range of code values at an input to said override circuit such that all of said consecutive edge modulators would generate no transition for at least one of said code values, except for the action of said override circuit.

4. The pulse generating circuit of claim 1, wherein said override circuit is included within said code splitter and wherein said code splitter includes at least one storage element for storing a code value previous to a present code value for each of said corresponding outputs of said code splitter, wherein said code splitter determines that said previous code value and said present code value for a given one of said consecutive edge modulators are both no-transition code values, and reassigns said code values between said code streams in response to said determination.

5. The pulse generating circuit of claim 1, wherein said override circuit receives at least one output of said code splitter and provides said input of each consecutive edge modulators, wherein said consecutive edge modulators are coupled to said code splitter through said override circuit.

6. The pulse generating circuit of claim 1, further comprising:
- a delay for delaying an output of said code splitter shaper by one sample period; and
- a storage for storing a previous code value and a present code value for each of said code streams, and wherein said override circuit compares said previous code value, said present code value and a next code value for each of said code streams and permits said present code value of each of said code streams to extend to identical non-transition codes, in response to determining that said previous and next code values are such that the previous code value and next code value for each of said code streams are codes that generate a transition.

7. The pulse generating circuit of claim 6, wherein said override circuit further changes said present code value for at least one of said code streams in response to determining that said previous and next code values are such that the previous code value and next code value for either of said streams are non-transition codes.

8. The pulse generating circuit of claim 7, wherein said code splitter provides feedback to a quantizer of said delta-sigma modulator, wherein a limiting action of said override circuit on said streams is compensated in the noise-shaping performed by said delta-sigma modulator.

9. A method of generating a pulse-width modulated signal, comprising:
- noise-shaping a control input signal;
- quantizing a result of said noise-shaping;
- assigning codes to code streams provided as inputs to multiple consecutive edge modulators that total a result of said quantizing for each sample period of said quantizing, wherein assignment of remainder pulse counts is made between said consecutive edge modulators and wherein count values provided by said assigning extend to a range including at least one non-transition code; and
- adjusting a result of said assigning to override said assigning when two identical sequentially adjacent non-transition codes are assigned to one of said code streams.

10. The method of claim 9, wherein said assigning further performs mismatch shaping between said code streams.

11. The method of claim 9, wherein said quantizing provides a range of code values to said adjusting such that all of said code streams would have non-transition codes, except for said adjusting.

12. The method of claim 9, further comprising storing a result of said assigning for each of said code streams, and wherein said assigning determines that a next code value and a last code value of said code streams are both no-transition codes, wherein said adjusting is performed simultaneously with said assigning by trading code values between said code streams in response to said determining.

13. The method of claim 9, wherein said adjusting is performed subsequent to said assigning.

14. The method of claim 9, further comprising storing a previous code value and a present code value for each of said code streams, and wherein said adjusting compares said previous code value, said present code value and a next code value for each of said code streams and permits said present code value for both of said code streams to be non-transition codes in response to determining that said previous and next code values are such that the previous code value and next code value for both of said code streams are code that generate a transition.

15. The method of claim 14, wherein said adjusting further changes said present code value for at least one of said code streams in response to determining that said previous and next code values are non-transition codes.

16. A pulse generating circuit, comprising:
- a delta-sigma modulator;
- multiple consecutive edge modulators each having an input coupled to an output of said delta-sigma modulator; and
- means for assigning remainder pulse counts between said consecutive edge modulators except when sequentially adjacent non-transition codes would otherwise be supplied to said delta-sigma modulator; and
- a storage for storing a previous code value and a present code value for each of said consecutive edge modulators, and wherein said assigning means compares said previous code value, said present code value and a next code value for each of said consecutive edge modulators and permits said present code value for both of said consecutive edge modulators to be non-transition codes in response to determining that said previous and next code values are such that the previous code value and next code value for both of said consecutive edge modulators are codes that will each generate a transition during their respective modulator output periods.

17. The pulse generating circuit of claim 16, wherein said assigning means comprises code swapping means for swapping codes between said consecutive edge modulators.

18. The pulse generating circuit of claim 16, further comprising an adjusting means for changing said present code value for at least one of said consecutive edge modulators in response to determining that said previous and next code values are such that the previous code value and next code value for either of said consecutive edge modulators are non-transition codes.

19. The pulse generating circuit of claim 16, wherein said means for assigning remainder pulse counts further comprises means for mismatch shaping between said multiple consecutive edge modulators.

\* \* \* \* \*